(12) United States Patent
Schröck et al.

(10) Patent No.: US 12,095,602 B2
(45) Date of Patent: Sep. 17, 2024

(54) TRANSMITTER WITH A WAVE SHAPE MEASUREMENT STAGE

(71) Applicant: RENESAS DESIGN AUSTRIA GMBH, Graz (AT)

(72) Inventors: Andreas Schröck, Graz (AT); Stefan Heibl, Graz (AT); Christian Röck, Graz (AT)

(73) Assignee: RENESAS DESIGN AUSTRIA GMBH, Graz (AT)

( * ) Notice: Subject to any disclaimer, the term of this patent is extended or adjusted under 35 U.S.C. 154(b) by 0 days.

(21) Appl. No.: 18/560,171

(22) PCT Filed: May 12, 2022

(86) PCT No.: PCT/EP2022/062961
§ 371 (c)(1),
(2) Date: Nov. 10, 2023

(87) PCT Pub. No.: WO2022/243174
PCT Pub. Date: Nov. 24, 2022

(65) Prior Publication Data
US 2024/0250856 A1 Jul. 25, 2024

(30) Foreign Application Priority Data
May 18, 2021 (EP) .................................... 21174242

(51) Int. Cl.
*H04L 27/06* (2006.01)
*H03M 1/12* (2006.01)
*H04B 5/77* (2024.01)

(52) U.S. Cl.
CPC .......... *H04L 27/06* (2013.01); *H03M 1/1285* (2013.01); *H04B 5/77* (2024.01)

(58) Field of Classification Search
CPC ........ H04L 27/06; H03M 1/1285; H04B 5/77; H04B 1/04; H04B 5/26; H04B 5/72; H01Q 1/2208
See application file for complete search history.

(56) References Cited

U.S. PATENT DOCUMENTS 9,654,181 B1 * 5/2017 Wobak ..................... H04B 5/79
10,170,287 B1 * 1/2019 Wu ................... H01J 37/32944
(Continued)

FOREIGN PATENT DOCUMENTS

| KR | 20200061283 A | 6/2020 |
| WO | 2018232464 A1 | 12/2018 |

OTHER PUBLICATIONS

International Search Report and Written Opinion, mailed Aug. 31, 2022, from PCT/EP2022/062961, 12 pages.
(Continued)

*Primary Examiner* — Omer S Khan
(74) *Attorney, Agent, or Firm* — Workman Nydegger

(57) ABSTRACT

A transmitter of an RFID communication system to transmit an amplitude modulated transmitter data signal in resonance in an RF-Field over the air and to receive a modulated receiver data signal, which transmitter comprises: a transmitter stage to generate the amplitude modulated transmitter data signal with a particular frequency and waveform based on a carrier signal generated by a carrier signal stage; an antenna connected to the transmitter stage via a matching circuit to transmit the amplitude modulated transmitter data signal in resonance in the RF-Field over the air; a receiver stage connected via the matching circuit to the antenna to receive the modulated receiver data signal; wherein the transmitter furthermore comprises a wave shape measurement stage to measure the shape of the received modulated receiver data signal with equivalent time sampling.

4 Claims, 5 Drawing Sheets

(56) References Cited

U.S. PATENT DOCUMENTS

2008/0136704 A1\* 6/2008 Chan ..................... G01S 7/282
                                                    342/201
2016/0047841 A1\* 2/2016 Fukuma ................ H03D 3/007
                                                    850/5

OTHER PUBLICATIONS

International Preliminary Report on Patentability, mailed Mar. 29, 2023 from PCT/EP2022/062961, 32 pages.
Aliasgari et al., "Chipless RFID Readers for Frequency-Coded Tags: Time-Domain or Frequency-Domain?", IEEE Journal of Radio Frequency Identification, vol. 4, No. 2, Mar. 30, 2020, pp. 146-158.

\* cited by examiner

TRANSMITTER WITH A WAVE SHAPE MEASUREMENT STAGE

FIELD OF THE INVENTION

The present invention relates to a transmitter of an RFID communication system to transmit an amplitude modulated transmitter data signal in resonance in an RF-Field over the air and to receive a modulated receiver data signal, which transmitter comprises:
- a transmitter stage to generate the amplitude modulated transmitter data signal with a particular frequency and waveform based on a carrier signal generated by a carrier signal stage;
- an antenna connected to the transmitter stage via a matching circuit to transmit the amplitude modulated transmitter data signal in resonance in the RF-Field over the air;
- a receiver stage connected via the matching circuit to the antenna to receive the modulated receiver data signal.

BACKGROUND OF THE INVENTION

Known Radio Frequency IDentification communication systems use integrated circuits like ST25R3916 in RFID readers or transmitters to communicate with active or passive transponders. In a typical application, a passive receiver (e.g. transponder or tag) stores product identification of a product to which it is attached and the transmitter (e.g. reader) is used to obtain this product information. The transmitter is powered and generates a magnetic RF-Field emitted by its antenna. When the transmitter and the tag are within close proximity of each other, the transmitter generated RF-Field is induced into the antenna of the tag and used to power the passive tag. The tag also has a transceiver to receive the signal from the reader and to transmit a response back to the transmitter as load modulated receiver data signal.

There are standards like ISO/IEC18000-3 or ISO/IEC 14.443 Type A and B or ISO15.693 or ECMA-340 13.56 MHz Near Field Communication (NFC) or the NFC Forum or company standards like Felica from company Sony that define protocols and types of modulation used to transmit information between the tag and the reader. Some or all of these standards define, to use an amplitude modulation to transmit an amplitude modulated data signal with digital data within the RF-Field over the air to the tag. ISO14.443 Type A for instance furthermore defines to use a modified Miller encoding to encode the data signal into an encoded data signal for the transmission.

NFC communication systems have been applied to more and more different applications. What hinders todays development and implementation process is the fact that technically complex and expensive test equipment is needed to test a new developed transmitter to ensure that the RF-Field emitted complies with the relevant standards and national regulations. Parameters like an overshoot or an undershoot or non-monotonic edges must be checked and need to be within limits defined in the standards and regulations.

FIG. 1A shows one example of a 100% amplitude modulated data signal on Tx-Pins of a state of the art transmitter which Tx-Pins are connected via an amplifier and matching circuit to the antenna of the transmitter to generate an RF-Field. FIG. 1B shows the RF-Field nearby the antenna of the transmitter for the amplitude modulated data signal of FIG. 1A with an overshoot of the rising edge of the envelope of the RF-Field.

FIG. 2A shows another example of a 10% ASK amplitude modulated data signal on Tx-Pins of a state of the art transmitter which Tx-Pins are connected via a matching circuit to the antenna to generate an RF-Field. FIG. 2B shows the RF-Field nearby the antenna of the transmitter for the amplitude modulated data signal of FIG. 2A with an undershoot of the falling edge and an overshoot of the rising edge of the envelope of the RF-Field.

FIG. 3A shows a further example of a 100% amplitude modulated data signal on Tx-Pins of a state of the art transmitter which Tx-Pins are connected via a matching circuit to the antenna to generate an RF-Field. FIG. 3B shows the RF-Field nearby the antenna of the transmitter for the amplitude modulated data signal of FIG. 3A with an overshoot of the rising edge and an effect called "ringing" at the end of the rising edge of the envelope of the RF-Field.

State of the art test equipments like measurement antennas, oscilloscopes, or dedicated measurement equipment to capture the transmitted waveform and processing equipment to post-process and display the results are needed, what hinders the fast implementation of new applications for NFC communication systems.

ALIASGARI JAVAD ET AL: "Chipless RFID Readers for Frequency-Coded Tags: Time-Domain or Frequency-Domain" discloses a transmitter of an RFID communication system to transmit amplitude modulated transmitter data signal in resonance in an RF-Field over the air and to receive a modulated receiver data signal.

SUMMARY OF THE INVENTION

It is an object of the invention to ease the technical complexity to measure the wave shape of the transmitted modulated transmitter data signal in the RF-Field.

This object is achieved with a transmitter that furthermore comprises a wave shape measurement stage to measure the shape of the received modulated receiver data signal with equivalent time sampling.

This concept of realizing a wave shape measurement stage within the transmitter enables to avoid the need of external test equipment completely. As there are limits to the processing power within the transmitter integrated circuit, the inventive wave shape measurement stage is realized with equivalent time sampling. Equivalent time sampling as such is a known technology to be used in oscilloscopes or other equipment to measure the wave shape of periodic signals generated by other devices. This technology never has been used and realized in the integrated circuit that generates and transmits the signal of which the wave shape has to be measured. The claimed transmitter with a wave shape measurement stage uses a delay stage to delay its own carrier signal in the transmitter or receiver path by a variable phase offset or delay period. The received modulated receiver data signal is analyzed by a mixer and a DC compensation stage retrieves the DC signal part at 0 Hz frequency of the output signal of the mixer that is sampled by an AD converter of the receiver stage. These sampled data of the wave shape of the received modulated receiver data signal may be processed within the transmitter or passed over to other data processing equipment like a computer to post-process the sampled data to combine them to provide the measured shape of the received modulated receiver data signal.

These and other aspects of the invention will be apparent from and elucidated with reference to the embodiments described hereinafter. The person skilled in the art will understand that various embodiments may be combined.

DETAILED DESCRIPTION OF EMBODIMENTS

Figure 1A:
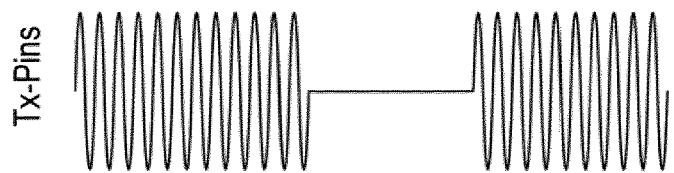
FIG. 1A shows one example of a 100% amplitude modulated data signal on Tx-Pins of a state of the art transmitter which Tx-Pins are connected via an amplifier and matching circuit to the antenna to generate an RF-Field.
Figure 1B:
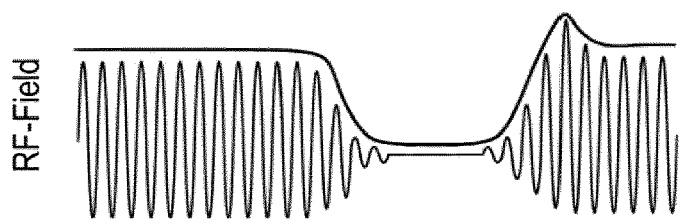
FIG. 1B shows the RF-Field nearby the antenna of the transmitter for the amplitude modulated data signal of FIG. 1A with an overshoot of the rising edge of the envelope of the RF-Field.
Figure 2A:
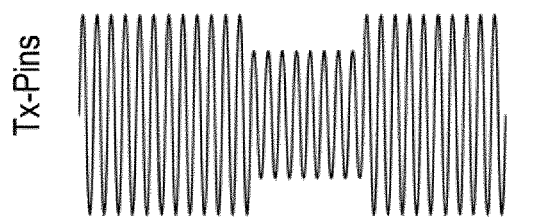
FIG. 2A shows another example of a 10% ASK amplitude modulated data signal on Tx-Pins of a state of the art transmitter which Tx-Pins are connected via a matching circuit to the antenna to generate an RF-Field.
Figure 2B:
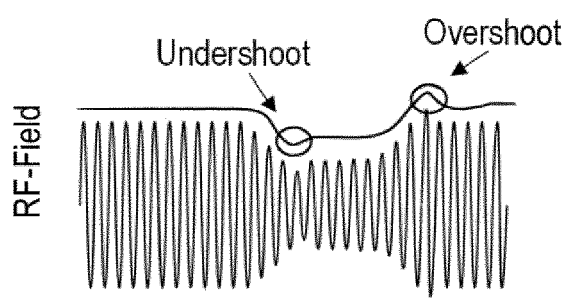
FIG. 2B shows the RF-Field nearby the antenna of the transmitter for the amplitude modulated data signal of FIG. 2A with an undershoot of the falling edge and an overshoot of the rising edge of the envelope of the RF-Field.
Figure 3A:
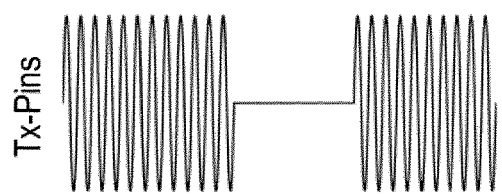
FIG. 3A shows a further example of a 100% amplitude modulated data signal on Tx-Pins of a state of the art transmitter which Tx-Pins are connected via a matching circuit to the antenna to generate an RF-Field.
Figure 3B:
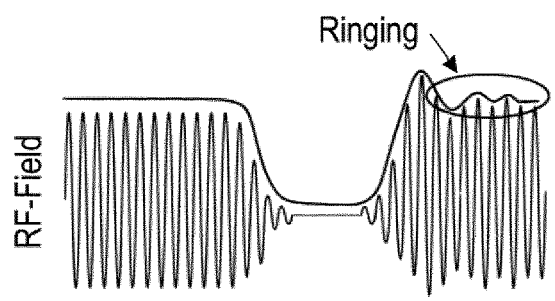
FIG. 3B shows the RF-Field nearby the antenna of the transmitter for the amplitude modulated data signal of FIG. 3A with an overshoot of the rising edge and an effect called "ringing" at the end of the rising edge of the envelope of the RF-Field.
Figure 4:
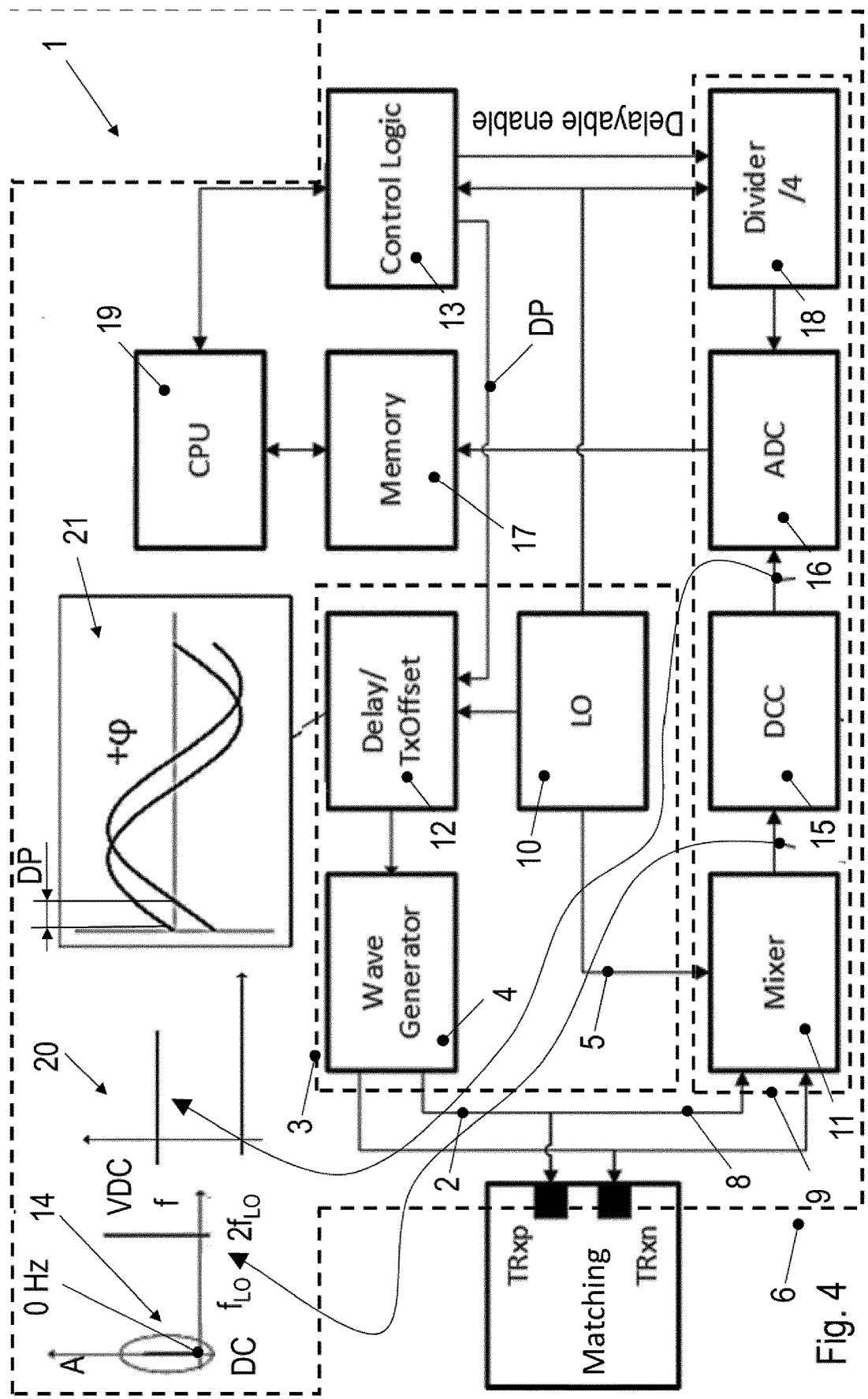
FIG. 4 shows a first embodiment of a transmitter to transmit an amplitude modulated data signal and measure the waveform of the received modulated receiver data signal according to the invention.

FIG. 4 shows a transmitter 1 to transmit an amplitude modulated transmitter data signal 2 in an RF-Field over the air to a receiver of an RFID communication system according to a first embodiment of the invention. The transmitter 1 comprises transmitter stage 3 with a wave generator 4 to generate the amplitude modulated transmitter data signal 2 with a particular frequency and waveform based on the carrier signal 5 provided by carrier signal stage 10. The RFID communication system complies to the NFC Standard ISO 18.092 which defines a resonance frequency of the carrier signal 5 of 13.56 MHz with the waveform of a sinus. The RFID communication system furthermore complies to ISO/IEC 14.443 Type A and B or ISO15.693 or ECMA-340 13.56 MHZ. The transmitter 1 is realized in an integrated circuit 6 and provides the amplitude modulated transmitter data signal 2 via an amplifier at Tx-Pins Tx of the integrated circuit 6. A matching circuit is connected to the Tx-Pins Tx and matches the impedances to an antenna 7. The matching circuit and the antenna 7 are arranged to transmit the amplified amplitude modulated transmitter data signal 2 in resonance to the close-by receiver that could be realized as passive or active tag or any other active device like e.g. a mobile phone. Even if there is no receiver in the RF-Field of the transmitter 1, there are disturbances of things within the RF-Field and influences of the matching circuit and the antenna 7 that lead to a received signal and in particular to a received modulated receiver data signal 8. The shape of the transmitted waveform is very important in an NFC system and needs to be tested for compliance with the relevant standards. Parameters like over/undershoot, non-monotonic edges or other disturbances must be checked and need to be within the limits defined in the relevant standards.

Transmitter 1 comprises a receiver stage 9) connected via Rx-Pins Rx via the matching circuit to the antenna 7 to receive the modulated receiver data signal 8. The receiver stage 9 comprises a mixer 11 to mix the received modulated receiver data signal 8 with the carrier signal 5 of the carrier signal stage 10. Transmitter 1 furthermore comprises a wave shape measurement stage to measure the shape of the received modulated receiver data signal 8 with equivalent time sampling. Equivalent time sampling is known to a man skilled in the art and enables to capture periodic signals with a much higher effective sample rate than the actual sample rate of an AD converter used. During each repetition of the periodic signal other parts of the wave shape are sampled and combined in post-processing of the sampled data to provide the high resolution signal. Such equivalent time sampling is known to be used in oscilloscopes to improve the details of the measured and displayed signal.

Transmitter 1 with its waves shape measurement stage for the first time realizes a wave shape measurement based on equivalent time sampling of the received modulated receiver data signal received in the RF-Field generated by the transmitter 1 itself. This is needed to enable to test a new designed transmitter 1 or a transmitter 1 in a new implementation. To achieve that, wave shape measurement stage comprises a delay stage 12 to delay the carrier signal 5 used in the transmitter stage 3 by a delay period DP provided and steered by a control logic 13 to the delay stage 12. As an example, if the periodic signal is a SIN signal and should be sampled with a resolution of 360 samples the AD converter used would need to take these 360 samples during one period of the 13.56 MHz signal what involves high processing power. With equivalent time sampling only 36 samples per period would be needed during 10 periods where different parts of the signal are sampled. Control logic 13 steers the delay stage 12 to delay the carrier signal 5 used by the wave generator 4 to generate the amplitude modulated transmitter data signal 2 by the appropriate delay periods DP or phases q to sample different parts of the received modulated receiver data signal 8 as can be seen in diagram 21 of FIG. 4. The same effect would be achieved where in another embodiment of the invention the carrier signal 5 used for the mixer 11 in the receiver stage would be delayed by the delay stage 12 and the undelayed carrier signal 5 would be used by the wave generator 4.

The mixer 11 provides an output signal A shown in a diagram 14 of FIG. 4. This output signal A comprises an amplitude at the frequency of 2×13.56 MHZ (=27.12 MHz) and a DC component at 0 Hz frequency that is relevant for further processing, as it comprises the information about the actual amplitude of the periodic received modulated receiver data signal 8 for the particular delay period DP steered by control logic 13.

Receiver 9 and wave shape measurement stage furthermore comprises a DC compensation stage 15 connected to the mixer 11 to retrieve the DC signal part of the output signal A of the mixer 11. Reference is made to a patent EP 3 267 589 B1 of the same applicant that describes the principal function and use of the DC compensation stage 15 (=DC cancellation stage in EP 3 267 589 B1), which is a feedback-loop to cancel the DC component at 0 Hz frequency for further signal processing of a modulated received data signal 8 from another NFC device in the RF-Field. For this invention disclosed here, the DC component determined by the DC compensation stage 15 is used to test the compliance of the waveform of the received modulated receiver data signal 8 with the sinusoidal waveform. The amplitude information of the DC component retrieved by this approach is not an absolute value, but can be used for relatively processing as waveshape analysis since all NFC defined timing and over/under—shoot parameters are relatively to itself.

In this way the DC compensation stage 15 connected to the mixer 11 and retrieves the DC signal part of the output signal A of the mixer 11 as amplitude of the received sinusoidal modulated receiver data signal 8 for the particular delay period DP provided by the control logic 13, as can be seen in diagram 20 of FIG. 4. Receiver 9 and wave shape measurement stage furthermore comprises an AD converter stage 16 to sample the amplitude of the analogue output signal A of the mixer 11 as digital data to be stored in a memory 17 for the particular delay period DP. Due to the use of equivalent time sampling it is possible to sample the output signal A of mixer 11 with a lower sample rate and in this embodiment a divider 18 is used to divide the carrier signal 5 of carrier signal stage 10 by the integer number of four to provide the signal with the sample frequency for AD converter 16. The integer number multiplied by the number of delays per period of the carrier signal 5 equals the minimum number of samples needed to measure the wave shape of the period of the received modulated receiver data signal 8 with equivalent time sampling.

The DC signal part of the output signal A of mixer 11 retrieved by DC compensation stage 15 can be calculated by the following formulas. By multiplying a sinusoid with itself the result is twice the fundamental frequency plus a DC offset which represents via shifting the phase, the scaled amplitude of the fundamental +90 degree phase-shift $$A_{LO}\sin(x) * A_{TRx}\sin(x+\varphi) = \frac{1}{2}(A_{LO} * A_{TRx} * \cos(\varphi) - A_{LO} * A_{TRx} * \cos(2x+\varphi))$$

$$DC \text{ part} = \frac{A_{LO} * A_{TRx}}{2}\cos(\varphi)$$

$A_{LO}$ = constant; $\varphi$ = Phaseshift or delay period $DP$; $A_{TRx}$ = Received Amplitude The digital data stored in memory 17 of the sampled amplitudes of the different delay periods DP are processed by a CPU stage 19 of the integrated circuit 6 of transmitter 1, which CPU stage 19 needs to have the appropriate processing power to combine the data and provide the result of the measured wave shape of the received modulated receiver data signal on a display of the reader. In another embodiment of the invention an external computer could process these data stored in memory 17 to display the result of the wave shape of the received modulated receiver data signal on a display of the computer.

Figure 5:
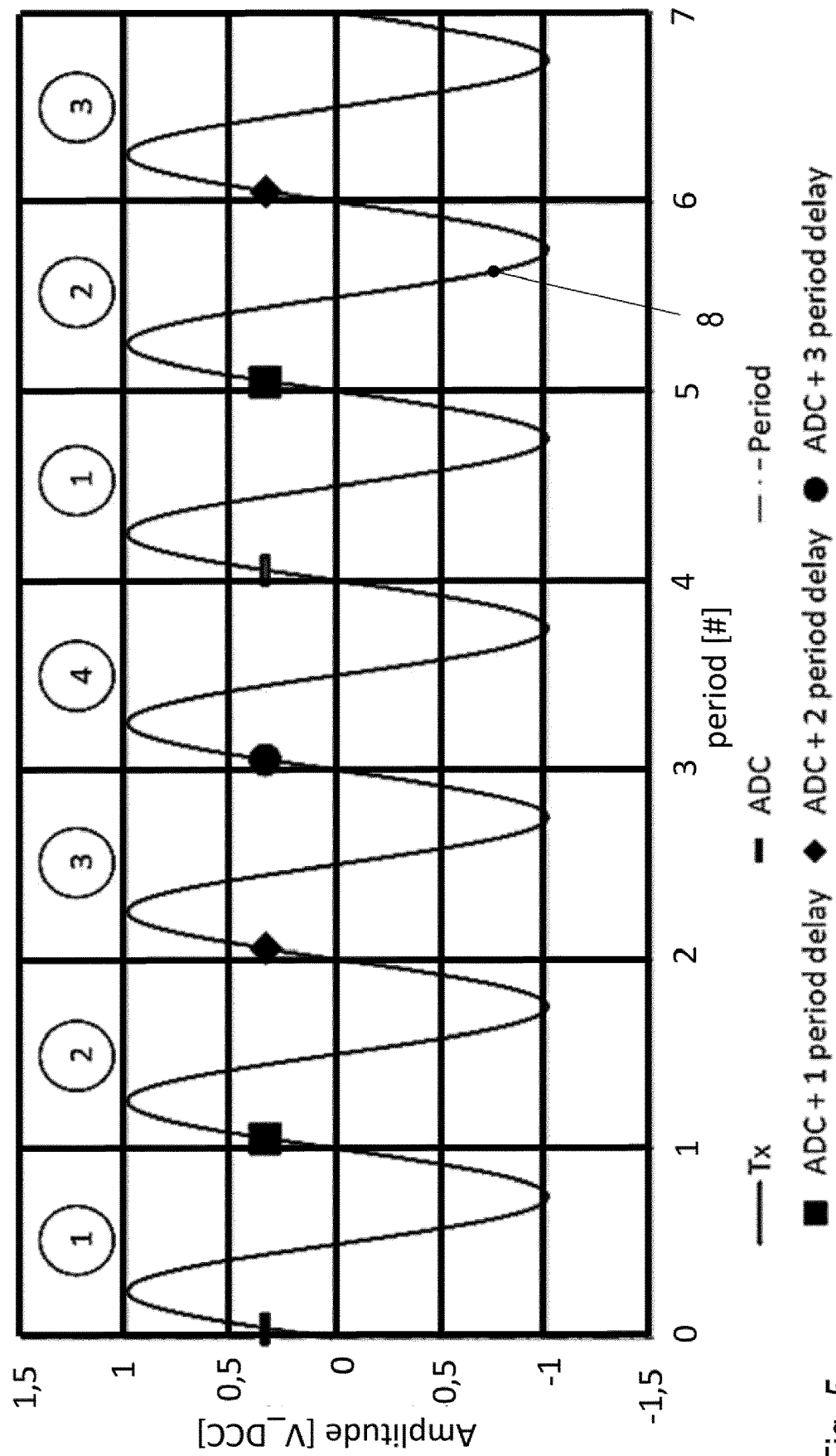
FIG. 5 shows some sample points at the output of an AD converter stage of the transmitter shown in FIG. 4 with different delay periods and a sampling clock of the carrier signal divided by the integer number four.
Figure 6:
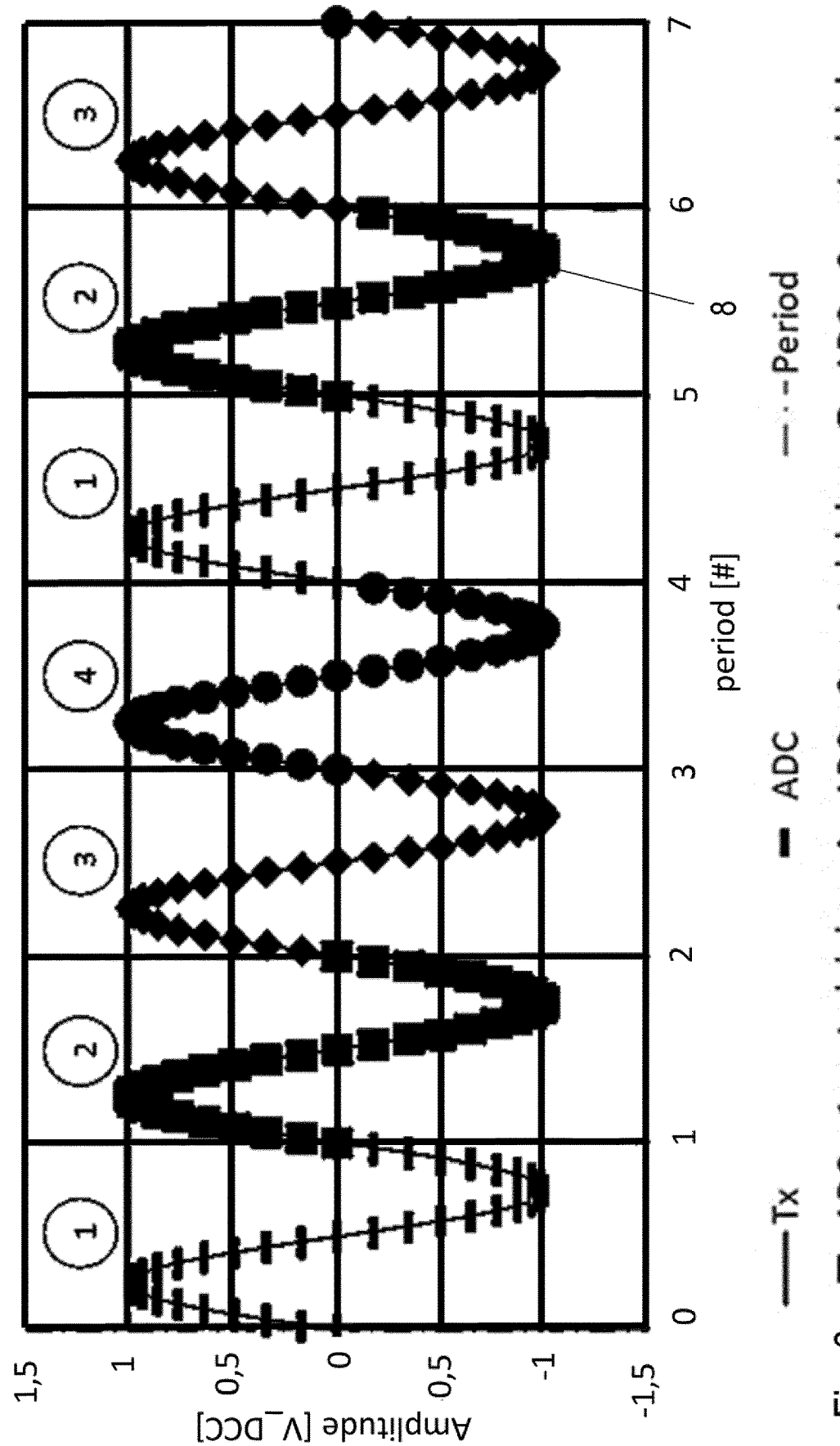
FIG. 6 shows all the sample points at the output of the AD converter stage of the signal of FIG. 5.

FIG. 5 shows seven periods of the received modulated receiver data signal 8. As the divider 18 in this embodiment is adjusted to divide the carrier signal by integer number four, the wave shape measurement stage of the transmitter 1 needs to analyze at least four periods of the received modulated receiver data signal 8 to combine all sampled amplitudes. These four periods are measured via enabling of the divider 18 at delayed periods controlled by control logic 13. The resolution of the measured signal is increased by using delay stage 12 up to the number of delayable steps which results in FIG. 6 . . . .

Figure 7:
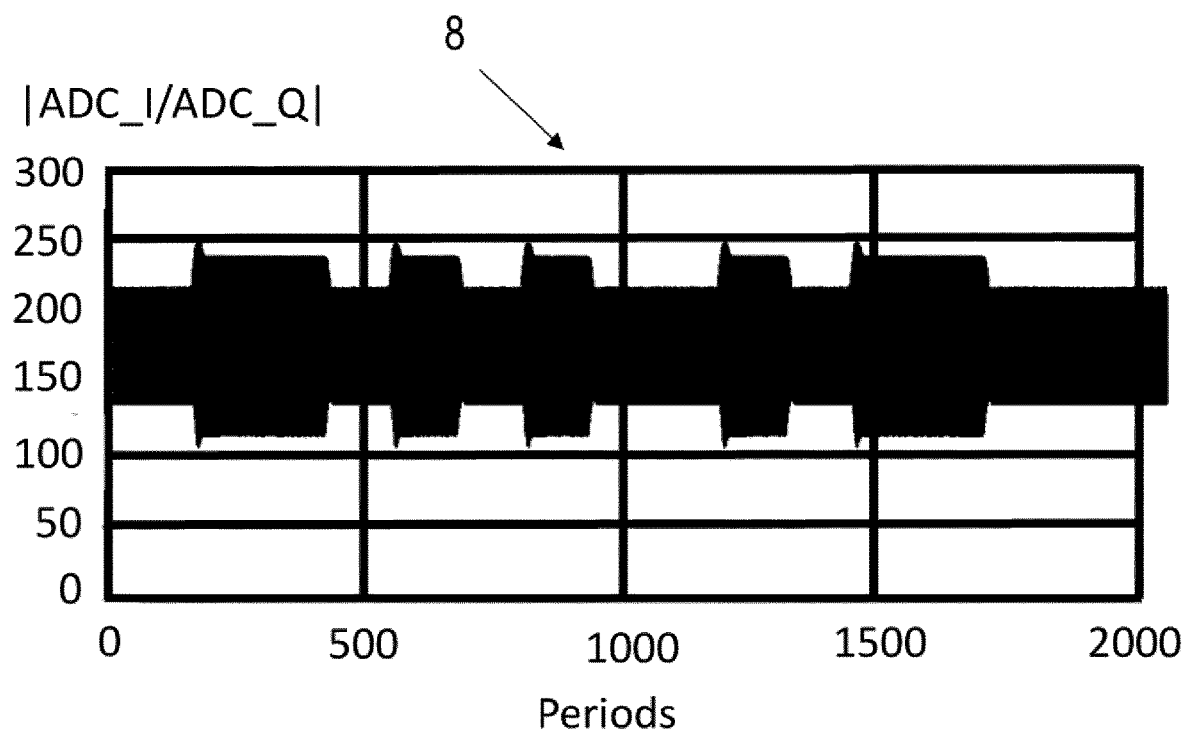
FIG. 7 shows a measured and reconstructed transmitted and received modulated receiver data signal of the transmitter of FIG. 4.
Figure 8:
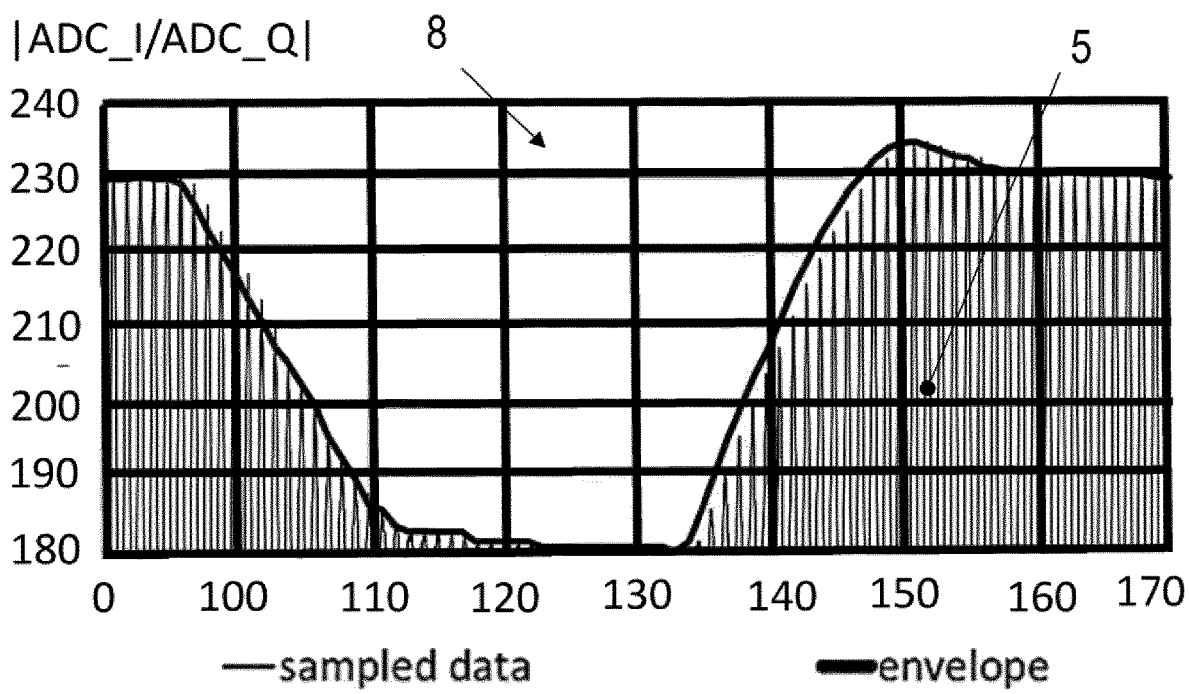
FIG. 8 shows a detail of the signal shown in FIG. 7 with an overshoot in the rising edge of a ISO 14.443 Type A modulated received modulated receiver data signal.

FIG. 7 shows a measured and reconstructed transmitted and received ISO 14.443 Type B modulated receiver data signal 8 of the transmitter 1 of FIG. 4 with over- and undershoots. FIG. 8 shows a detail of the signal with an overshoot in the rising edge of a ISO 14.443 Type A received modulated receiver data signal 8 as measured by the wave shape measurement stage.

Since the AD converter 16 conversion time and the sampling rate are limited by system divider 18, the control logic 13 is able to enable the divider 18 at different periods with full carrier signal stage 10 speed. This results in a selectable delayed AD converter 16 conversion start.

It has to be stated that such a wave generator 4 that is able to generate a sinus waveform wave by wave is known from EP 3 182 585 B1 of the same applicant. This prior art document discloses a digital power amplifier which generates a sinus wave by small increments of M digital waveforming bits which add up increments of output current to generate a sinus wave.

The inventive transmitter with the wave shape measurement stage can be used during tests of a new transmitter set-up (e.g. matching) to optimize the design of the reader with the integrated circuit of the transmitter. For these tests a receiver may be arranged within the RF-Field of the reader or not. But the inventive transmitter with the wave shape measurement stage can also be used during normal use of the reader to analyze the wave shape of the load modulated receiver data signal received from a tag or transponder in the RF-Field of the reader.

In further embodiments of the invention the divider could use other integer numbers to divide the carrier signal of the carrier signal stage to provide the signal with the sample frequency or rate for the AD converter. A lower sample rate needs less processing power, but more periods to gather all samples to reconstruct the complete wave shape of the received modulated receiver data signal.

The invention claimed is:

1. A transmitter of an RFID communication system to transmit an amplitude modulated transmitter data signal in resonance in an RF-Field over the air and to receive a modulated receiver data signal, the transmitter comprising:
   a transmitter stage configured to generate the amplitude modulated transmitter data signal with a particular frequency and waveform based on a carrier signal generated by a carrier signal stage;
   an antenna connected to the transmitter stage via a matching circuit to transmit the amplitude modulated transmitter data signal in resonance in the RF-Field over the air;

a receiver stage connected via the matching circuit to the antenna to receive the modulated receiver data signal; and a wave shape measurement stage to measure a shape of the received modulated receiver data signal with equivalent time sampling, wherein the receiver stage comprises a mixer to mix the received modulated receiver data signal with the carrier signal of the carrier signal stage and wherein the wave shape measurement stage comprises a delay stage to delay the carrier signal used in the transmitter stage or the carrier signal used for the mixer in the receiver stage by a delay period (DP) provided by a control logic to the delay stage, wherein the amplitude modulated transmitter data signal comprises a waveform of a sinus and wherein the wave shape measurement stage comprises a DC compensation stage connected to the mixer to retrieve a DC signal part at a frequency of 0 Hz of an output signal of the mixer as amplitude of the received modulated receiver data signal for the particular delay period (DP) provided by the control logic to be sampled by an AD converter stage of the receiver stage, wherein the DC compensation stage retrieves the DC part of the output signal according to the following formula:

$$DC \text{ part} = \frac{A_{LO} * A_{TRx}}{2}\cos(\varphi)$$

$A_{LO}$ = constant; $\varphi$ = phaseshift or delay;

$A_{TRx}$ = Received Amplitude.

2. The transmitter according to claim 1, wherein the wave shape measurement stage comprises a divider to divide the frequency of the carrier signal by an integer number as sampling clock for the AD converter stage, wherein the integer number multiplied by a number of delays per period of the carrier signal equals a minimum number of samples needed to measure the wave shape of a period of the received modulated receiver data signal with equivalent time sampling.

3. The transmitter according to claim 2, which control logic is built to activate a divider block at different clock cycles and control the delay stage.

4. The transmitter according to claim 1, wherein the carrier stage is built to generate a carrier signal with an NFC frequency of 13.56 MHz.

* * * * *